United States Patent [19]

Reznicek

[11] 4,037,749
[45] July 26, 1977

[54] HERMETICALLY SEALED ENVELOPE AND METHOD OF MAKING THE SAME

[75] Inventor: Kurt Reznicek, Allentown, Pa.

[73] Assignee: Bell Telephone Laboratories, Incorporated, Murray Hill, N.J.

[21] Appl. No.: 666,878

[22] Filed: Mar. 15, 1976

[51] Int. Cl.² .................... H01L 23/10; H01J 19/58
[52] U.S. Cl. ........................ 220/2.3 R; 174/52 H
[58] Field of Search ............... 220/2.1 R, 2.3 R; 174/52 H, 52 S

[56] References Cited

U.S. PATENT DOCUMENTS

| | | | |
|---|---|---|---|
| 2,965,962 | 12/1960 | Ollendorf et al. | 220/2.3 R X |
| 3,024,299 | 3/1962 | Nijhuis et al. | 174/52 H X |
| 3,024,519 | 3/1962 | Leinkram et al. | 174/52 H X |
| 3,115,957 | 12/1963 | Heil | 220/2.3 R X |
| 3,125,698 | 3/1964 | Persson | 220/2.3 R X |
| 3,182,117 | 5/1965 | Roovers | 174/52 H |
| 3,190,952 | 6/1965 | Bitko | 220/2.3 R X |
| 3,198,874 | 8/1965 | Dahl | 174/52 H |
| 3,226,820 | 1/1966 | Anthony et al. | 174/52 H X |

OTHER PUBLICATIONS

IBM Technical Disclosure Bulletin, vol. 5, No. 12, May 1963, p. 10 - "Semiconductor Device Package", J. Gow, III.

Primary Examiner—Stephen Marcus
Attorney, Agent, or Firm—Lucian C. Canepa; Maurice de Piciotto

[57] ABSTRACT

An hermetically sealed envelope comprises a base having a groove therein, a tubelike cover inserted within the groove, and a sealing member surrounding the cover within the groove. A cold weld between the member and the cover is achieved by permanently deforming the member within the groove. A vacuum-tight seal is thereby achieved in the field without the use of heat, large force, sealants or adhesives.

6 Claims, 7 Drawing Figures

HERMETICALLY SEALED ENVELOPE AND METHOD OF MAKING THE SAME

BACKGROUND OF THE INVENTION

This invention relates to vacuum-tight seals made substantially of metal and more particularly to hermetically sealed envelopes and to hermetic seals.

Hermetic seals have a plurality of applications, such as housings for solid state devices, e.g., transistors, diodes and similar electronic components. The operating characteristics of electrical, mechanical or electronic devices located in an environment subject to temperature and pressure variations are affected by such variations. By housing such devices in hermetic seals, these characteristics are rendered relatively independent from temperature variations, pressure, vibrations, shocks, and air and moisture attacks. The teachings of the present invention are particularly suitable for the housing of electromechanical filters and resonators which must be mounted in hermetically sealed envelopes in order to improve their frequency stability and isolate them from outside tensions and forces.

A known hermetic seal between a tubular section and a base is described in U.S. Pat. No. 3,198,874 to W. F. Dahl, wherein a seal is formed by mechanically interlocking the tubular section and the base. In this known arrangement, the end of the tubular section which is to be interlocked with the base is provided with a series of flanges designated as stress ring, compression ring, and control ring. The base is provided with an annular groove adapted to receive the stress and compression rings of the tubular section. A hydraulic or mechanical press applies pressure to the tubular section in a direction parallel to its axis for permanently deforming the stress and compression rings of the tubular section within the annular groove. Although this known method makes no use of sealing adhesives or heat to achieve a hermetic seal, the series of flanges formed at one end of the tubular section must be carefully machined in accordance with a complex configuration of rings and recesses. Furthermore, a relatively high pressure is required to deform the rings and allow material from the base to flow into a labyrinth formed by the rings and recesses.

Another known vacuum-tight envelope consists of two metallic parts connected together by means of their respective flanges. In such a known arrangement as described in U.S. Pat. No. 3,182,117 to W. A. Roovers, one of the flanges is provided at its periphery with a sharp ridge with two flanks directed toward the other flange and pressed into the material thereof. The first flange is embraced by an edge of the other flange. Such an arrangement requires forces of the order of 750 kilograms in order to achieve a cold-welded envelope.

BRIEF DESCRIPTION OF THE INVENTION

The foregoing problems are solved in accordance with an embodiment of the present invention wherein a hermetic seal formed between a base and a tubelike body comprises an elevated portion on the surface of the base, the body having one end portion fitted in the proximity of the elevated portion; and a separate sealing member positioned around the end portion and cold welded to the body through permanent deformation. A vacuum-tight seal is thus achieved between the base and the tubelike body. In a particular illustrative embodiment of the present invention, the tubelike body and the elevated portion have circular cross sections.

In a preferred embodiment of the present invention, a groove is formed on the surface of the base, and one end of the tubelike body is fitted in the groove. A deformable sealing member is positioned around the body within the groove. By means of a relatively small force and a flat-faced forming tool, the sealing member is permanently deformed within the groove thereby achieving a cold weld between the member and the body.

In accordance with another illustrative embodiment of the invention the elevated portion is formed by a nonmetallic ring cemented on a nonmetallic substrate, and a metallic layer is deposited on the internal surface of the ring. The sealing member is then positioned and permanently deformed between the body and the metallic layer.

One object of a preferred embodiment of the present invention is to eliminate sealants, adhesives, or heat in achieving a vacuum-tight sealed envelope.

Another object of the present invention is to realize a hermetically sealed envelope using a small pressing force and a simple tool for achieving a vacuum-tight seal.

A still further object of the present invention is to realize economical hermetically sealed envelopes.

These and other objects and advantages of this invention will appear more fully upon consideration of the various illustrative embodiments now to be described in detail in connection with the accompanying drawings.

DETAILED DESCRIPTION OF THE DRAWINGS

Figure 1A:
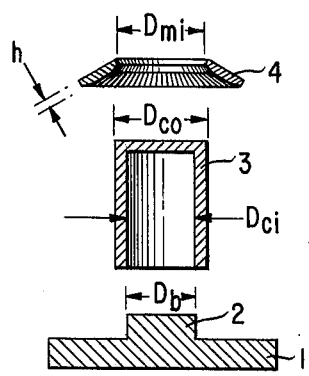
FIGS. 1A and 1B, respectively, show an exploded and a mounted schematic illustration of one embodiment of the present invention.
Figure 1B:
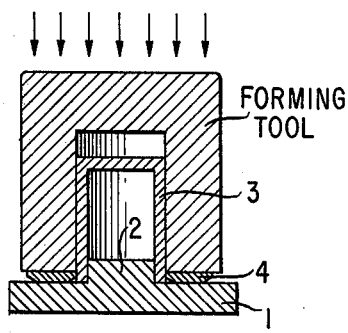

Referring now to one illustrative embodiment of the invention, as shown in FIGS. 1A and 1B, a hermetically sealed envelope comprises three parts; namely, a base 1, a tubelike body or cover 3, and a sealing member 4. The cover and the sealing member may be made of any metal exhibiting cold welding, such as nickel, copper, steel or aluminum. The base 1 is provided on its surface with an elevated portion 2. One end of the body or cover 3 is positioned around the elevated portion 2. Both the body 3 and the elevated portion 2 can be of any cross-sectional configuration, such as circular, elliptical, oval, etc. For illustrative purposes only, the following description will refer to an embodiment wherein the cover 3 and the elevated portion 2 have circular cross sections. The elevated portion 2 has a diameter $D_b$ slightly smaller than the internal diameter $D_{ci}$ of the cover 3 in order to enable the fitting of the end portion of the cover around the elevated portion. The sealing member 4 is a flat ring having, before any deformation, an inner diameter from 2 to 20 percent smaller than the outer diameter $D_{co}$ of the cover 3. The ring 4 is first deformed such that its inner diameter $D_{mi}$ is larger than the outer diameter $D_{co}$ of the cover 3. Such first deformation takes place, for example, by means of a metal sphere pressed against the inner diameter of the ring, the latter being placed over a substrate or table of limited elasticity, such as rubber. Any other means of deforming the sealing ring can be used provided that the deformed ring is similar to the one shown in FIG. 1A.

The three parts, i.e., the base 1, the cover 3, and the sealing ring 4, are mounted such that first one end of the cover 3 is fitted around the elevated portion 2 of the base 1. Then, the already deformed sealing ring 4 is mounted around the end portion of the cover. By means of a flat-faced forming tool, such as a metal cylinder having an internal diameter slightly larger than $D_{co}$ and surrounding the cover 3, the sealing ring is permanently deformed by applying to such a tool a force parallel to the axis of the cylindrical cover 3. Therefore, at the end of such step, the sealing ring 4 is deformed as shown in FIG. 1B. A part of the embodiment shown in FIG. 1B is shown in greater detail in FIG. 1C, wherein under the effect of the forces applied by the forming tool to the sealing ring 4, a cold weld is achieved between the cover 3 and the sealing ring 4.

Figure 1C:
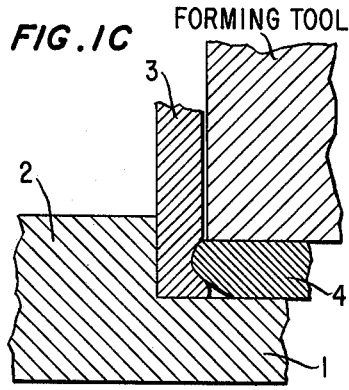
FIG. 1C is an enlarged view of one section of the embodiment of FIG. 1B.

The illustrative embodiment of the present invention shown in FIGS. 1A-1C imposes restrictions on the dimensions of the various parts of the hermetically sealed envelope. In order to achieve a reliable hermetic seal, the elevated portion 2 of the base 1 should advantageously have a height at least equal to dimension $h$ of the deformed ring 4 shown in FIG. 1A. Furthermore, the thickness of the cover 3, i.e., $(D_{co}-D_{ci})/2$, must be sufficiently thin to enable a deformation of the end portion of the cover, as shown in FIG. 1C. This deformation results in a cold weld between the sealing ring 4 and the cover 3, and a high pressure of cover 3 against the elevated portion 2. Hermetically sealed envelopes having covers of up to six inches in diameter $D_{co}$ are realizable in accordance with the teachings of the present invention.

Figure 2A:
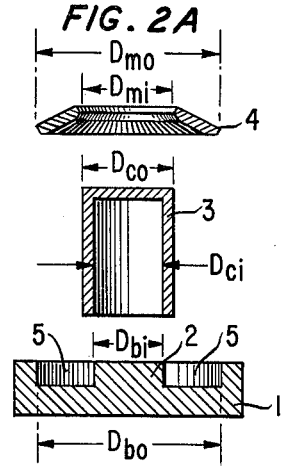
FIGS. 2A and 2B, respectively, show an exploded and a mounted schematic illustration of another embodiment of the present invention.
Figure 2B:
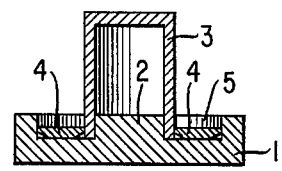

One preferred embodiment of the present invention is shown in FIGS. 2A and 2B. The different parts of such embodiment are identified by the same numbers and are functionally identical to the parts described in accordance with FIGS. 1A-1C. As shown in FIG. 2A, the base 1 has an elevated portion 2 formed by a groove 5. Such a groove may have any cross-sectional configuration, such as circular, elliptical or oval. For illustrative purposes only, groove 5 will be hereafter described as an annular groove. In accordance with the features of the present invention, groove 5 has an inner diameter $D_{bi}$ smaller than the inner diameter of the cover 3. The sealing member 4, after being deformed as specified above, has an outer diameter $D_{mo}$ smaller than the outer diameter $D_{bo}$ of the groove 5. In accordance with the present method, one end of cover 3 is fitted around the elevated portion 2 within the groove. Next, the predeformed sealing ring 4 is inserted around the end portion of the cover within the groove. By means of a flat-faced forming tool, the sealing member 4 is permanently deformed within the groove to achieve a cold weld between the metal sealing ring 4 and the metal cover 3. As discussed above, the same requirements as to the dimensions of the sealing member compared to the dimensions of the elevated portion are also applicable to the preferred embodiment. In other words, the depth of the groove 5 is advantageously at least as large as the dimension $h$ of the sealing ring 4.

Figure 3:
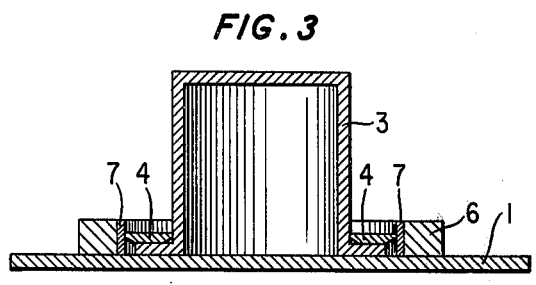
FIG. 3 shows still another illustrative embodiment of a hermetically sealed envelope according to the present invention.

In the embodiment shown in FIG. 3, the base 1 is made of a nonmetallic material while the cover 3 is a metal cylinder. In order to achieve a hermetic seal in accordance with the principles of the present invention, a nonmetallic ring 6 is cemented to the surface of the nonmetallic base 1. In order to improve the seal, the inner surface of the nonmetallic ring 6 is coated with a metallic layer 7. The cover 3 is positioned over the base 1 within the ring 6. By inserting the sealing ring 4 around the cover 3 and by permanently deforming the sealing ring as shown in FIG. 3, a hermetic seal is achieved between the base 1 and the cover 3. As described in the embodiments of FIGS. 1 and 2 a cold weld is achieved between the sealing ring 4 and the cover 3. The metallic layer 7 is deposited on the inner surface of the nonmetallic ring 6 in order to prevent the destruction of such ring upon the permanent deformation of the sealing member 4.

Figure 4:
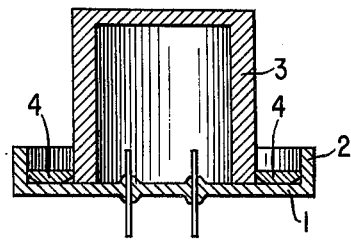
FIG. 4 shows a further illustrative embodiment of the present invention.

The embodiment shown in FIG. 4 is another configuration wherein a metal base 1 has an elevated portion 2 surrounding the cover 3. A sealing member 4 is positioned between the cover and the elevated portion and is permanently deformed to achieve the hermetically sealed envelope. In such embodiment as shown in FIG. 4, the vertical walls of the cover 3 should be thicker than the corresponding walls in the embodiments of FIGS. 1-3 since there is no elevated portion of the base within the cover.

It is to be understood that the embodiments described herein are merely illustrative of the principles of the invention. Various modifications may be made thereto by persons skilled in the art without departing from the spirit and scope of the invention.

What is claimed is:

1. A hermetically sealed envelope comprising:
    a base having an elevated portion on the surface thereof;
    a tubelike cover having one end portion fitted in the proximity of said elevated portion; and
    a separate sealing member positioned around said end portion and cold welded to said cover through permanent deformation thereby achieving a vacuum-tight seal between said base and said cover.

2. A hermetically sealed envelope according to claim 1 wherein the elevated portion is formed by a nonmetallic ring having a metal layer on the inner surface thereof and cemented to the surface of a nonmetallic base, whereby said sealing member is positioned between said metal layer and said end portion.

3. A hermetically sealed envelope according to claim 1 wherein said cover has one end portion fitted around said elevated portion.

4. A hermetically sealed envelope according to claim 3, wherein said cover and said elevated portion have circular cross sections.

5. A hermetically sealed envelope according to claim 3 wherein said elevated portion is part of a groove formed on the surface of the base.

6. A hermetic seal formed between a base and a tubelike body comprising:
    an elevated portion on the surface of the base, the body having one end portion thereof fitted in the proximity of said elevated portion; and
    a separate sealing member positioned around said end portion and cold welded to said body through permanent deformation thereby achieving a vacuum-tight seal between said base and said body.

* * * * *